United States Patent Office 3,238,614

Patented Mar. 8, 1966

3,238,614

METHOD OF CONNECTING CONTACTS TO THERMOELECTRIC ELEMENTS

Josef Intrater, New York, N.Y., assignor to General Instrument Corporation, Newark, N.J., a corporation of New Jersey No Drawing. Original application Oct. 16, 1961, Ser. No. 145,491, now Patent No. 3,203,772, dated Aug. 31, 1965. Divided and this application Feb. 17, 1965, Ser. No. 438,166

8 Claims. (Cl. 29—498)

The present invention relates to an improved method for securing conductive contact elements to other electrical elements, and particularly to lead-tellurium thermoelectric elements.

This is a division of application Serial No. 145,491, filed October 16, 1961, now Patent No. 3,203,772.

The thermoelectric properties of appropriately doped lead-tellurium compounds are well known, and have led to the extensive use of such compounds in thermoelectric applications. Such use has been widespread despite the difficulties experienced on a production scale in making electrical and physical connection between conductive contacts and the thermoelectric elements themselves.

Many factors are involved in achieving this electrical and physical connection between the contacts and the thermoelectric elements. From an electrical point of view, the surface resistance between the contact element and the thermoelectric element must be kept as low as possible. From a chemical point of view, the thermoelectric element must be kept free of contaminants which, if present even in minute quantities, would seriously adversely affect the thermoelectric characteristics of that element. From a mechanical point of view, the bond between the thermoelectric element and the contact element must be sufficiently strong to maintain the two elements in secured-together condition. From an environmental point of view, the mechanical and electrical connections must be effective over a very wide temperature range and must be capable of withstanding severe vibration and shock.

With the thermoelectric elements, contact elements formed of iron have been used in the past, the two elements being bonded to one another upon the application of pressure at high temperatures of approximately 900° C. However, since the temperature coefficient of expansion of lead-tellurium compounds is approximately twice that of iron, this type of bond is unsatisfactory when the unit is subjected to high operating temperatures (on the order of 450° C. and up) or cyclically varying temperatures—the contact resistance between the contact element and the thermoelectric element rises markedly, probably because the differences in expansion of the two elements cause physical separation of the elements at their interface. Moreover, considerable difficulty has been experienced in attempting to obtain effective and reliable bonds between the contact and the thermoelectric elements in the first instance. Conventional brazing or soldering materials contaminate the thermoelectric element. Attempts have been made to produce a direct chemical bond between the iron and the lead-tellurium, but appreciable atomic interchange or diffusion takes place only at temperatures of 920° C. and above. At the lower temperature of 905° C. the iron changes its structure between the alpha and gamma phases, and a chemical bond effected in one phase loses its effectiveness when the iron assumes a different phase. Hence chemical bonds produced at 920° C. are substantially destroyed when the units cool to normal temperatures. In addition, the differences in expansibility of the thermoelectric and contact elements take their toll, the known bonds being incapable of resisting the strains incident upon these differences in expansibility. Here too, therefore, contact resistance rises greatly when the units are operated at elevated temperatures.

In accordance with the present invention it has been found that contact elements formed of iron or other appropriate conductive materials such as copper or ferritic stainless steel may be effectively chemically bonded to lead-tellurium thermoelectric elements without adversely affecting the thermoelectric characteristics thereof through the use of an intermediate bonding material comprising a homogeneous iron-tellurium intermetallic compound (which may also include lead as one of its homogeneously combined metallic constituents). Material of the specified type will, under practical operating conditions, bond itself both to the conductive element and to the thermoelectric element, and the atomic diffusion into the thermoelectric element which occurs is not deleterious to the functioning of the unit in the manner for which it is designed. Moreover, the bond formed is so strong as to be capable of withstanding the forces attendant upon differential expansion of the thermoelectric and contact elements when the temperature changes.

An examination of the iron-tellurium phase diagram reveals that there are two narrow ranges of relative proportions of those two elements where a homogeneous combination thereof exists at normal temperatures below their melting point as well as at higher temperatures above their melting point. These are designated the beta and epsilon intermetallic phases. The beta phase exists when the tellurium is present in proportions by weight of 69.55–69.57% of the combined iron and tellurium. In the epsilon phase the corresponding tellurium percentages by weight are approximately 82%. Comparable ternary homogeneous intermetallic compounds of iron, tellurium and lead are known to exist. All of these are applicable to the instant invention. The beta type iron-tellurium intermetallic compound is preferred over the epsilon type because the latter is normally brittle and has a greater tendency to oxidize, and the binary intermetallic compound is generally preferred over the ternary compound including lead for reasons of simplicity and expense. Accordingly, the specific aspects of this specification will relate to the use of the beta type homogeneous intermetallic iron-tellurium compound.

When brazing compounds of the type here specifically discussed are employed, chemical bonding both to the contact element and to the thermoelectric element is readily achieved at relatively moderate temperatures, and particularly, when iron-containing contact elements are involved, at temperatures below that at which phase changes in the iron occur. Atomic diffusion into the thermoelectric element does not adversely affect the thermoelectric characteristics thereof. A bond is produced which is exceptionally strong from a mechanical point of view and the resultant contact resistance between the contact element and the thermoelectric element is exceedingly low. When the completed unit is subjected to high temperatures the bond, rather than becoming deteriorated, as has been the case in the past, actually improves, since additional atomic diffusion takes place, so that the longer the unit is subjected to an elevated temperature the greater is the strength of the bond and the lower is its contact resistance.

The brazing material is produced by combining iron and tellurium in proper proportions to form the homogeneous intermetallic compound, and by subjecting the mixture to an appropriate elevated temperature in order to melt the constituents and bring about their homogeneous combination. Temperatures of 800° C. and up are effective in this regard, with a temperature of 850° C. being preferred. After the constituents have been subjected to this temperature for an appropriate period of time, the resultant homogeneous intermetallic compound is permitted to cool. It may then be ground and used as a powder, or it can be cooled in the form of a bar or ingot from which thin wafers may be sliced.

Since the presence of oxides is believed to be deleterious, the iron and tellurium (and other constituents if present) should be free of oxide, and the combination of the iron and tellurium to form the brazing compound should be carried out in a suitable non-oxidizing atmosphere. Indeed, all of the subsequent steps, too, should be carried out in a non-oxidizing atmosphere, and care should be taken throughout that the brazing compounds and the surfaces of the contact element and thermoelectric element which are to be bonded to one another should be kept free of oxides at all times.

Tellurium is volatile and tends to escape at elevated temperatures. Accordingly means may be provided (such as a pressurized atmosphere) for preventing the escape of tellurium, or an excess of tellurium may be included in the original constituents for the brazing material to make up for any loss of tellurium which might occur in any of the stages of manipulation. If an excess of tellurium is present the desired homogeneous intermetallic compound is formed and exists in conjunction with the excess of tellurium. The tellurium excess is not disadvantageous insofar as the formation of appropriate bond is concerned, and does not adversely affect the functioning of the thermoelectric element.

The next step is to chemically bond the iron-tellurium brazing material to one of the elements of the thermoelectric unit, preferably the contact element. This is done by applying the brazing material, either in the form of a powder or a wafer, to the appropriate surface of the contact element and then subjecting it to heat and moderate pressure. The precise temperature used is not critical. The higher the temperature, the more rapidly will chemical diffusion take place. It has been found that the use of temperatures between 730–800° C. for a period of approximately one minute produces a satisfactory bond when iron or ferritic stainless steel contact elements are employed. For higher temperatures, the time involved would be less, and for lower temperatures the time involved would be more. An excessive time-temperature schedule should be avoided, in part to minimize the loss of volatile tellurium and in part because excessive atomic diffusion may result in an actual eating away of the contact element.

After the contact element, with its surface thus coated with the brazing material chemically bonded thereto, has been permitted to cool, that coated surface is then applied to the appropriate surface of the lead-tellurium thermoelectric element, with the application of moderate pressure to ensure good contact and shape conformation, and the unit is again subjected to an elevated temperature for an appropriate period of time. A temperature of 835° C. or thereabouts is particularly effective when iron contact elements are involved, it being noted that this is well below the temperature at which the alpha-gamma iron phase transformation occurs. Here again, it will be understood, temperature and time are inversely related—the higher the temperature the less the time required, and vice-versa. A chemical bond will be produced between the brazing material and the thermoelectric element by reason of the diffusion of atoms, and further chemical diffusion and bonding will take place between the brazing material and the contact element.

When the thus assembled unit has cooled the contact element will be secured to the thermoelectric element by means of a chemical bond which is exceptionally strong and is capable of withstanding the mechanical stresses resulting from the differences in thermal expansibility of the contact element and the thermoelectric element. In addition the contact resistance between the contact element and the thermoelectric element will be exceptionally low and will remain low—indeed even becoming lower—if the unit is operated at elevated temperatures.

The homogeneous iron-tellurium brazing compound may contain, in addition to excess tellurium and/or lead, such dopants or promoters as are normally used in the thermoelectric element itself, these dopants or promoters tending to diffuse into the thermoelectric element while the chemical bond is being formed, thereby to improve or modify the thermoelectric characteristics of that element. Other substances such as selenium or sulphur may be present in small amounts without deleterious effect.

From the above it will be seen that the present invention provides for an effective chemical bond between lead-tellurium thermoelectric elements and the contact elements therefor, which bond is produced in a manner readily susceptible of use in quantity production runs at low cost, and without requiring expensive or complicated equipment. Moreover, the bond produced is superior both mechanically and electrically to the bonds previously attained with materials of this type, and is not adversely affected if the bonded units are operated at high temperatures.

While the disclosure here has been specifically with reference to lead-tellurium thermoelectric elements, the brazing materials here disclosed may be used advantageously in connection with other types of elements.

While but a limited number of embodiments have been here specifically disclosed, it will be apparent that many variations may be made therein, all within the scope of the appended claims.

I claim:

1. The method of bonding a conductive contact element to a lead-tellurium element which comprises forming a homogeneous intermetallic compound comprising iron and tellurium, applying said compound to a surface of one of said elements at an elevated temperature for a time sufficient to produce an effective chemical bond between said compound and said surface of said one of said elements, and then applying said compound-bearing surface of said one of said elements to a surface of the other of said elements at an elevated temperature for a time sufficient to produce an effective chemical bond between said compound and said surface of said other of said elements.

2. The combination of claim 1, in which said compound comprises the beta-type iron-tellurium intermetallic compound.

3. The combination of claim 1, in which said compound comprises the epsilon-type iron-tellurium intermetallic compound.

4. The method of bonding a conductive contact element to a lead-tellurium element which comprises forming a homogeneous intermetallic compound comprising iron and tellurium, applying said compound to a surface of one of said elements at an elevated temperature for a time sufficient to produce an effective chemical bond between said compound and said surface of said one of said elements, and then applying said compound-bearing surface of said one of said elements to a surface of the other of said elements at an elevated temperature below 905° C. for a time sufficient to produce an effective chemical bond between said compound and said surface of said other of said elements.

5. The combination of claim 4, in which said compound comprises the beta-type iron-tellurium intermetallic compound.

6. The combination of claim 4, in which said compound comprises the epsilon-type iron-tellurium intermetallic compound.

7. The method of bonding a conductive contact element to a lead-tellurium element which comprises forming a homogeneous intermetallic compound comprising iron, tellurium and lead, applying said compound to a surface of one of said elements at an elevated temperature for a time sufficient to produce an effective chemical bond between said compound and said surface of said one of said elements, and then applying said compound-bearing surface of said one of said elements to a surface of the other of said elements at an elevated temperature for a time sufficient to produce an effective chemical bond between said compound and said surface of said other of said elements.

8. The method of bonding a conductive contact element to a lead-tellurium element which comprises forming a homogeneous intermetallic compound comprising iron, tellurium and lead, applying said compound to a surface of one of said elements at an elevated temperature for a time sufficient to produce an effective chemical bond between said compound and said surface of said one of said elements, and then applying said compound-bearing surface of said one of said elements to a surface of the other of said elements at an elevated temperature below 905° C. for a time sufficient to produce an effective chemical bond between said compound and said surface of said other of said elements.

References Cited by the Examiner

UNITED STATES PATENTS

| | | | |
|---|---|---|---|
| 2,811,571 | 10/1957 | Fritts et al. | 136—5 |
| 2,877,283 | 3/1959 | Justi | 136—4 |
| 3,000,092 | 9/1961 | Sucro | 29—472.9 |

JOHN F. CAMPBELL, *Primary Examiner.*